US008412111B2

(12) United States Patent
Talwar et al.

(10) Patent No.: US 8,412,111 B2
(45) Date of Patent: Apr. 2, 2013

(54) TESTING VOICE-BASED OFFICE EQUIPMENT FOR IMMUNITY TO INTERFERENCE FROM WIRELESS DEVICES

(75) Inventors: Vivek Talwar, Edgewater, NJ (US);
Stephen Berger, Georgetown, TX (US);
Werner Schaefer, Novato, CA (US);
Jeff Rodman, San Francisco, CA (US);
Tony Griffiths, Worcestershire (GB);
Joseph Liguori, Brick, NJ (US)

(73) Assignees: Goldman, Sachs & Co., New York, NY (US); Avaya Inc., Basking Ridge, NJ (US); Stephen Berger, Georgetown, TX (US); Werner Schaefer, Novato, CA (US); Jeff Rodman, San Francisco, CA (US); Tony Griffiths, Malvern, Worcestershire (GB)

(*) Notice: Subject to any disclaimer, the term of this patent is extended or adjusted under 35 U.S.C. 154(b) by 1518 days.

(21) Appl. No.: 11/636,885

(22) Filed: Dec. 11, 2006

(65) Prior Publication Data

US 2007/0159199 A1    Jul. 12, 2007

Related U.S. Application Data

(60) Provisional application No. 60/750,727, filed on Dec. 15, 2005.

(51) Int. Cl.
*H04B 17/00* (2006.01)

(52) U.S. Cl. .................. 455/67.12; 455/67.11
(58) Field of Classification Search ............... 455/67.11, 455/67.12, 423, 67.14, 115.1, 115.2, 226.1, 455/226.2, 226.4
See application file for complete search history.

(56) References Cited

U.S. PATENT DOCUMENTS

| 5,589,773 | A | 12/1996 | Berger et al. |
| 5,754,054 | A | 5/1998 | Berger |
| 7,340,218 | B2 * | 3/2008 | Shoulders et al. ......... 455/67.11 |

OTHER PUBLICATIONS

White Paper, "Draft American National Standard for Electromagnetic Compatibility—Recommended Practice for Immunity Measurement of Electrical and Electronic Equipment", Jul. 1, 2002, IEEE Standards Department. Copyright © 2002 IEEE. 55pgs.

* cited by examiner

*Primary Examiner* — Eugene Yun
(74) *Attorney, Agent, or Firm* — Perkins Coie LLP

(57) ABSTRACT

According to some embodiments, a method includes placing a device under test (DUT) in a test chamber and applying a pulse-modulated RF wireless test signal to the DUT in the test chamber. The method further includes detecting an acoustic output of the DUT. In addition or as an alternative to applying the pulse-modulated test signal, the test signal strength may be at a level of 30 V/m or 90 V/m. If the DUT is a telephone, it may be coupled via a voice signal path to another telephone, and an output of the other telephone may also be detected.

18 Claims, 5 Drawing Sheets

TESTING VOICE-BASED OFFICE EQUIPMENT FOR IMMUNITY TO INTERFERENCE FROM WIRELESS DEVICES

CROSS-REFERENCE TO RELATED APPLICATION

This application claims benefit from provisional patent application No. 60/750,727, filed Dec. 15, 2005, which is incorporated herein by reference.

FIELD

The present invention relates to electronic equipment. In some embodiments, the present invention relates to methods and apparatus for testing electronic equipment for immunity to interference.

BACKGROUND

As new kinds of electronic equipment have continued to proliferate, the opportunities for interference between items of equipment have increased. One type of interference that is increasingly a problem is interference experienced by telephones, wireless headsets or conference room voice amplification (microphone) systems from portable wireless devices such as the well-known BlackBerry® portable electronic mail device. An aggravating factor in terms of potential interference is the likely increased proximity of potentially interfering devices to devices that may suffer interference. For example, one individual may being speaking on a telephone in his/her cubicle, while another individual in a neighboring cubicle is using his/her BlackBerry device or speaking on a cellular telephone. As another example, an individual may be using his/her BlackBerry in a meeting in a conference room in close proximity to a microphone that is part of a voice amplification system for the conference room. In both of these examples, audible interference may be produced in the voice-based device, so that voice communication is prevented or degraded.

Accordingly, the present inventors have recognized a need for improved testing of voice-based devices to determine whether the devices are subject to interference from nearby wireless devices.

SUMMARY

To address the foregoing, embodiments of the present invention concern a method, an apparatus, and a medium storing processor-executable process steps to place a device under test (DUT) in a test chamber, apply a pulse-modulated RF wireless test signal to the DUT in the test chamber and detect an acoustic output of the DUT. To simulate the proximity of potential interfering devices in real-world situations, the test signal strength may be on the order of 30 V/m for some DUTs and on the order of 90 V/m for other DUTs.

In some aspects, the DUT in the test chamber may be a telephone which is coupled to second telephone that is not in the test chamber. An output of the second telephone may also be detected to determine whether interference is transmitted from the DUT telephone in the test chamber to the second telephone With these and other aspects of the invention, improved testing of voice-based electronic devices may be provided to determine whether the devices are subject to interference in situations likely to be encountered during real-world use of the electronic devices.

With these and other advantages and features of the invention that will become hereinafter apparent, the invention may be more clearly understood by reference to the following detailed description of the invention, the appended claims, and the drawings attached hereto.

DETAILED DESCRIPTION

In general, and for the purposes of introducing concepts of embodiments of the present invention, voice-based electronic devices may be subjected to testing for susceptibility to interference in accordance with test procedures that more accurately reflect certain potential real-world conditions than prior art testing has done. For example, the test signal applied to the electronic devices may be pulse-modulated rather than amplitude-modulated. Also, the strength of the test signal may be substantially higher than in prior art practices to reflect the potentially extreme proximity of sources of interference that may be experienced in the real world by the devices to be tested.

Figure 1:
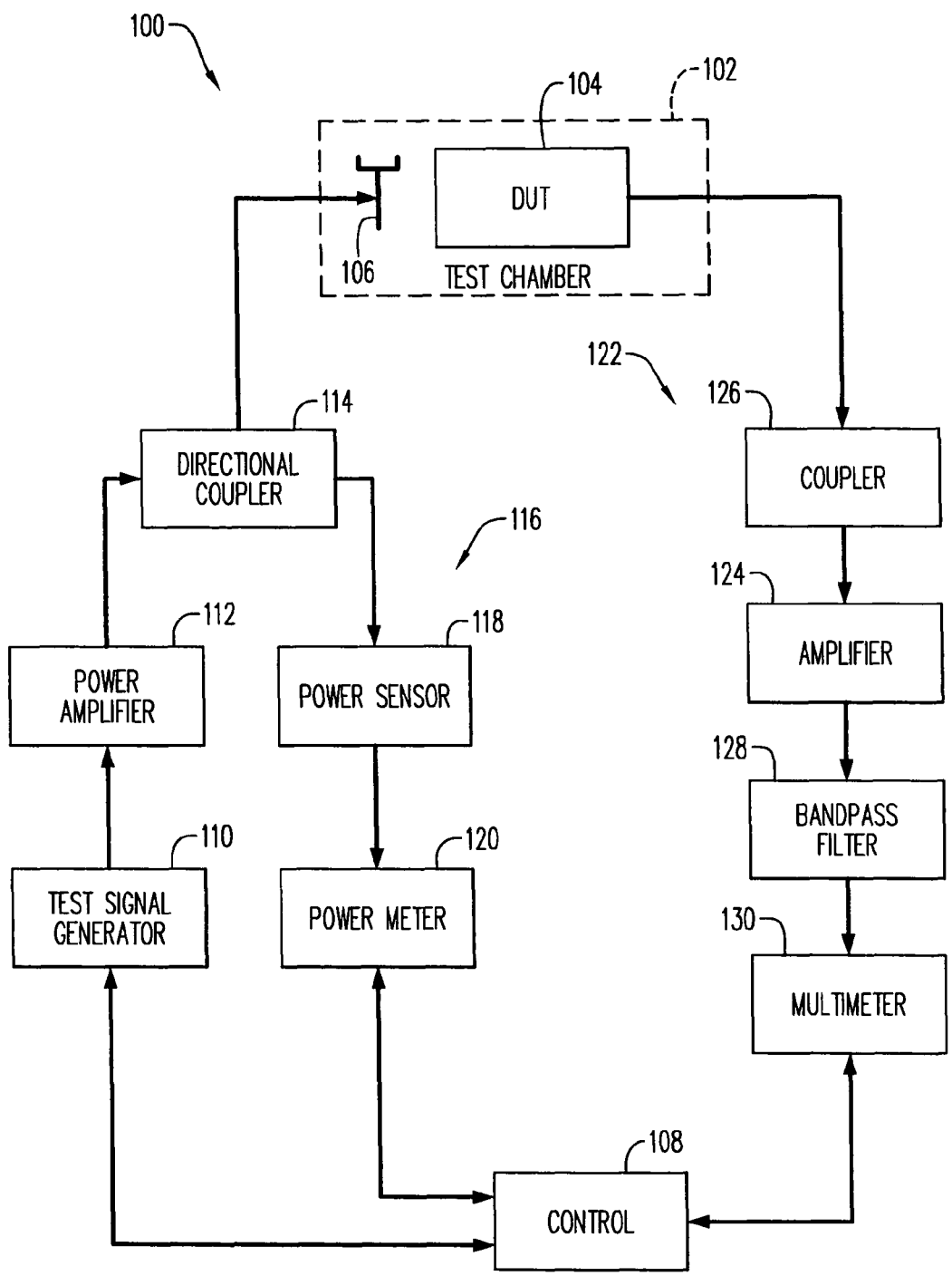
FIG. 1 is a block diagram of a test arrangement consistent with the present invention.

Features of some embodiments of the present invention will now be described by first referring to FIG. 1, where a block diagram of one embodiment of a test arrangement 100 is shown. As shown, test arrangement 100 includes a number of different components which cooperatively operate to perform testing of electronic devices to determine to what extent, if any, the electronic devices are vulnerable to interference from certain wireless devices.

As depicted, test arrangement 100 includes a test chamber 102. The test chamber 102 may be, for example, any one of a number of different types of test chambers conventionally employed in testing of electronic devices. For example, the test chamber 102 may be of a type conventionally employed for testing for vulnerability to interference. Among other possibilities, the test chamber 102 may be a GTEM (gigahertz transverse electromagnetic cell) chamber, a reverberation test chamber, an anechoic test chamber or a semi-anechoic test chamber. The test chamber need not be identical to known test chambers but rather may, for example, be specially designed in accordance with known principles as informed by the teachings of this invention.

Reference numeral 104 indicates a device under test (DUT) which has been placed in the test chamber 102. The DUT 104 may, but need not, be considered part of the test arrangement 100. The DUT 104 may be any one of a number of different types of electronic devices. For example, the DUT 104 may be a telephone (e.g., a conventional fixed telephone and/or speakerphone, a cordless telephone or a cellular telephone), a wireless headset (including a microphone and at least one earphone), or a conference room microphone (e.g., a gooseneck microphone).

The test arrangement 100 also includes an antenna 106 which is installed (permanently or temporarily) in the test chamber 102 to radiate a test signal in the test chamber 102, thereby to apply the test signal to the DUT 104 in the test chamber 102. The antenna 106 may be a conventional off-the-shelf item, and may be a biconical antenna, a log periodic antenna or may be formed of standard gain horns.

The test arrangement 100 further includes a control device 108, which may function as the "brains" of the test arrangement 100. The control device 108 may control operation of the test arrangement 100 and may tabulate results of tests performed in the test arrangement 100. As will be seen, the control device 108 may be constituted, at least in part, by conventional computer hardware such as a conventional personal computer. Further details of the control device 108 will be discussed below.

Still further, the test arrangement 100 may include a test signal generator 110. The test signal generator is coupled to and under the control of the control device 108. The test signal generator 110 may be like or generally similar to conventional test signal generators for interference immunity testing, except that the test signal generator may be such as to generate or be driven or controlled to generate a pulse-modulated test signal. For example, the test signal generator may be driven/controlled to generate a signal formed of 100 microsecond pulses, repeated at a 100 Hz repetition rate, of an RF carrier signal. The carrier frequency may, in some test procedures performed in the test arrangement, be varied throughout (stepped through) a frequency range of, say, 800 MHz to 6.0 GHz. In some examples, the frequency may be increased to traverse the range in steps of 1% of the current frequency from the low end of the range to the top of the range. Other frequency ranges and/or step sizes may also or alternatively be employed.

In addition, the test arrangement 100 may include a power amplifier 112 which is coupled to the test signal generator 110 to amplify the test signal generated by the test signal generator 110. Although not indicated in the drawing, the power amplifier 112 may also be coupled to the control device 108 to allow the control device 108 to control the degree of amplification provided by the power amplifier 112. Thus the control device 108 may be allowed to control the power level of the test signal applied to the DUT 104 in the test chamber 102.

Further, the test arrangement 100 may include a directional coupler 114 which connects an output of the power amplifier 112 to the antenna 106 so that the amplified test signal is radiated in the test chamber 102 by the antenna 106. The directional coupler 114 also couples the output of the power amplifier 112 to a feed-back path 116. The feed-back path 116 includes a power sensor 118 and a power meter 120 for detecting and measuring the power level of the amplified test signal output from the power amplifier 112. The feed-back path 116 is coupled to the control device 108 to provide to the control device 108 an input that indicates the power level of the amplified test signal. Based on this input, the control device 108 may be able to control the level of the test signal so that the test signal is radiated at a desired level in the test chamber 102.

Still further, the test arrangement 100 includes a detection path 122. The detection path 122 includes an amplifier 124 and a coupler 126 by which the amplifier is coupled to the DUT 104 to receive a signal or signals output from the DUT 104. As only schematically indicated in the drawing, in some embodiments coupling to the DUT 104 may be via an acoustic pickup (e.g., a microphone) positioned outside of the test chamber 102 to pick up an acoustic output of the DUT 104. In other embodiments, a suitable RF-immune microphone may be placed inside the test chamber for acoustic coupling to the DUT 104, with the electrical signal from such a microphone coupled to the amplifier 124. A microphone or other pickup located in or near the test chamber will be considered associated with the test chamber.

The detection path 122 further includes a bandpass filter 128 coupled to the amplifier 124 and a multimeter 130 coupled to the filter 128 to measure the level of the DUT output, as amplified by the amplifier 124 and filtered by the filter 128. The multimeter 130 is coupled to the control device 108 to provide a measurement output to the control device 108. The measurement provided by the multimeter 130 may be indicative of a degree of interference, if any, experienced by the DUT 104 as a result of the application to the DUT 104 of the test signal.

Figure 2:
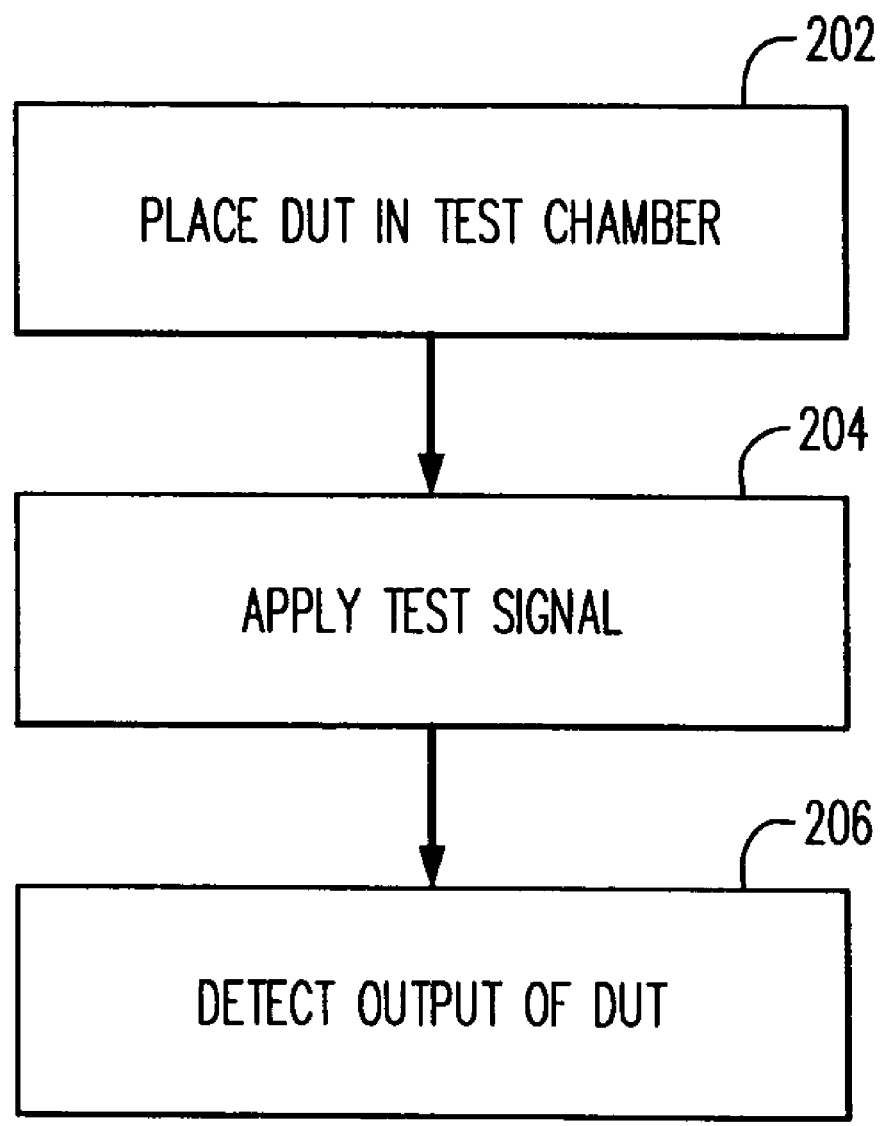
FIG. 2 is a flow diagram that illustrates an exemplary process that may be performed in the test arrangement of FIG. 1.

FIG. 2 is a flow diagram that illustrates an exemplary process that may be performed in the test arrangement 100. At 202 in FIG. 2, the DUT 104 is placed in the test chamber. Before or after the DUT 104 is placed in the test chamber 102, the DUT 104 is coupled so that its output is provided to the detection path 122. At 204, the test signal is applied to the DUT 104 in the test chamber. That is, the test signal is generated by the test signal generator 110, amplified by the power amplifier 112 and coupled to the antenna 106 so that the antenna 106 radiates the test signal in the test chamber 102. Example frequency and modulation characteristics of the test signal were described above in connection with discussion of the test signal generator 110. In some embodiments, the test signal may be amplified to such a degree that the field strength of the test signal in at least a portion of the test chamber 102 is at least 30 V/m. Such a signal strength may be applied to all types of DUTs, except that for devices connected to be connected to wireless transmitters (e.g., wireless headsets or assistive listening devices (amplifier modules)) the test signal strength may be at least 90 V/m in at least a portion of the test chamber. The field strength of 30 V/m corresponds to a distance of about 15 cm between a potentially interfering wireless transmitter and the device (e.g., a telephone) that potentially may experience interference. The field strength of 90 V/m corresponds to a situation in which the potentially interfering device is directly physically connected to the device (e.g. a headset) that potentially may experience interference.

At 206 in FIG. 2, the detection path 122 of the test arrangement 100 may detect and/or measure the output of the DUT (e.g., simultaneously with application of the test signal) to determine whether and/or to what extent the DUT is or may be vulnerable to interference from wireless devices. The measurements output from the detection path 122 may be provided to the control device 108, which may store, tabulate and/or analyze the measurements to provide an indication as to whether or not the DUT 104 is vulnerable to RF interface.

In some embodiments, the DUT 104 is operated in each of its normal operating modes while in the test chamber 102, and the full range of test signals is applied during each of the operating modes.

If the DUT 104 is battery powered, it may be advisable to install a fresh battery in the DUT for use during testing. It may be desirable that the battery have a voltage, when no load is applied, that is within 5% of the battery's rated voltage.

In a case where the DUT 104 is a telephone that includes a handset, a sound pressure level that does not exceed 40 dB(A) at the handset may be considered acceptable.

In a case where the DUT 104 is arranged to be interfaced to a headset, the headset should be installed for the test, and a sound pressure level that does not exceed 40 dB(A) at the headset may be considered acceptable.

In a case where the DUT 104 includes a speakerphone, a test result obtained during speakerphone mode in which the sound pressure level measured at a distance of 25 cm in the direction of maximum acoustic output from the speaker does not exceed 46 dB(A) may be considered acceptable. As to test results obtained with the DUT 104 not in speakerphone mode, it may be an acceptable measurement if the sound pressure level measured at a distance of 25 cm in the direction of maximum acoustic output from the speaker does not exceed 46 dB(A) or the ambient noise level, whichever is lower (i.e., no detectable acoustic output). In other embodiments, the measurement may be taken at a distance of less than 25 cm with adjustments to the above-mentioned thresholds. Such adjusted thresholds may be determined, for example, by transmitting to the DUT a tone that produces a sound pressure of 46 dB(A) at 25 cm and measuring the resulting sound pressure at the alternative distance(s).

As for other consideration relating to test results, it may be determined that the test results are acceptable if the DUT 104 does not suffer a reset, loss of data, change in LED state, blanking or changing in displayed data, disconnection from a call or any ongoing disruption of the device operation during the test. It may be acceptable for the DUT 104 to exhibit momentary, self-correcting transient events.

Prior to the test proper, it may be desirable to test the detection path 122 without the DUT present to assure that the test signal does not cause a change in the detected sound pressure levels of other monitoring output.

During the test, it may be desirable to support the DUT in the test chamber in such a way that there are not significant RF reflecting objects within a distance of at least 2 wavelengths of the frequency of measurement, or at least a distance such that the total reflections from such objects are kept at least 20 dB below the desired direct test signal. Support structures such as expanded foam and very low dielectric constant plastics may be used for supporting the DUT.

A check for reflections may be made when calibrating the field uniformity. To check for reflections, standing waves or other influence from nearly objects, an isotropic probe may be moved ¼ wavelength relative to the support structure. The frequency band may then be rescanned to compare the results.

It may be desirable that the RF ambient and acoustic noise floor be more than 20 dB below the intended test field strength.

In a case where the test chamber is an anechoic chamber, one of the following procedures may be used.

If the DUT is large and has many cables, the DUT and the cables may be divided into test sections, with each section tested separately.

In other cases, the test may be reiterated for each of vertical and horizontal orientations of the illuminating antenna and for three positions of the DUT, with the DUT rotated 120° between the three positions, so that a total of six test iterations are performed.

In other cases, the antenna may be oriented with a diagonal (ortho-angle) of a cube that contains the test volume, and the DUT may be rotated 120° among three test positions, with the test iterated once for each DUT position.

For test frequencies that are less than or equal to 2 GHz, the calibration technique described in International Electrotechnical Commission standard IEC 6100-4-3 may be employed. For test frequencies over 2 GHz, one of the following calibration methods may be used.

The first method is suitable for relatively large DUTs or for DUTs with extensive cable harnesses. For this method, the test area is divided into two sections and a plane is defined at the leading edge of each section. Calibration is performed for each section in turn. A first plane is located at the face of the first section, which includes the location for the DUT housing and its immediate area. An isotropic probe and (subsequently) the DUT will be positioned with the leading edge at the first plane. A second plane is located at the leading edge of the cable harness area, which is the second section. The second plane is at the midpoint of the wiring loom between the DUT and any ancillary or support equipment.

A transmitting antenna is placed so that its tip is no closer than 1 meter from the first plane. The height of the antenna above the floor of the test chamber is at least 1 meter. A field probe is placed in the first section and power is applied to the transmitting antenna. Controlled measurements are made to establish the required forward power into the antenna to give the required unmodulated test field at the first plane. The calibration is performed with the antenna both vertically and horizontally oriented. The same procedure then follows for the second plane and second section.

The second method may be appropriate when the DUT can be moved to ensure that each defined section of the DUT is tested in turn. In this method, a transmitting antenna is placed so that its tip is no closer than 1 meter from the predefined test plane. The antenna height above the floor of the test chamber is at least 1 meter. A field probe is placed in the test plane and power is applied to the transmitting antenna. Controlled measurements are made to establish the required forward power into the antenna to give the required unmodulated test field. The calibration is performed with the antenna both vertically and horizontally oriented.

In another test technique, the test signal is applied with a dipole antenna in close proximity to the DUT. To calibrate the test set up, an isotropic RF probe is placed on the circumference of a circle of rotation at the point closest to the dipole antenna. The dipole antenna is illuminated and is raised and lowered to find the point of maximum field strength. The power feed level required for the desired field strength is determined for each frequency.

During the actual testing, the DUT is placed in the intended test position and connected to the monitoring and support equipment. The dipole antenna is in the position determined during calibration and is energized. The required frequency range is scanned, with adjustments in power level as indicated during calibration. The dipole antenna is raised or lowered so that at least one tip and the center of the dipole antenna traverse the height of the DUT. The frequency range is scanned during the vertical scan. The DUT is rotated twice through 120° with the vertical scan by the dipole antenna repeated for each new position of the DUT. The polarization of the dipole antenna is then changed and the vertical scans and rotations of the DUT are repeated.

Figure 3:
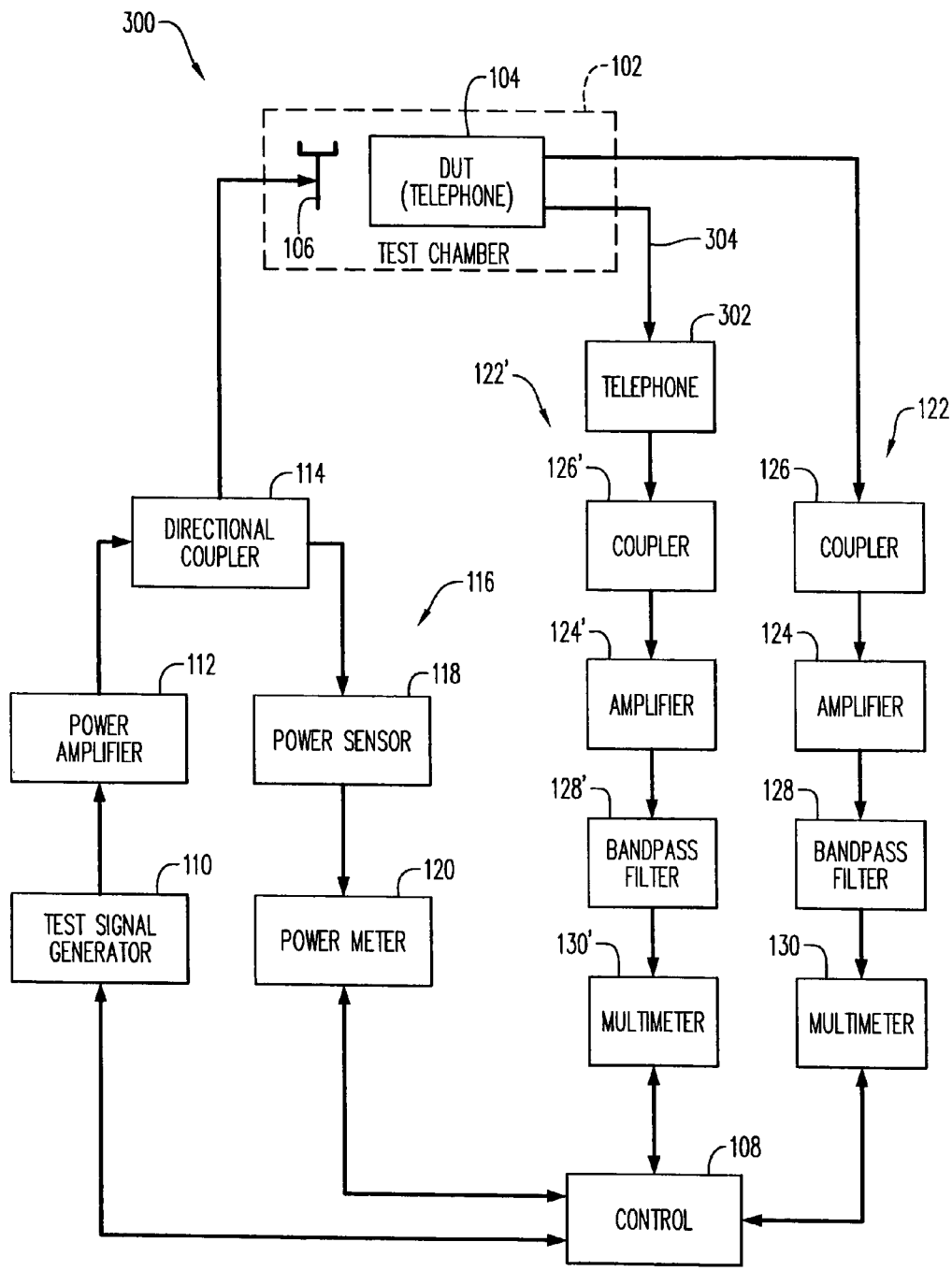
FIG. 3 is a block diagram of a test arrangement consistent with another embodiment of the invention.

FIG. 3 is a block diagram of a test arrangement 300 consistent with another embodiment of the invention. In the test arrangement 300, it is assumed that all of the components of the arrangement 100 (FIG. 1) are present, with the further assumption that the DUT 104 is a telephone. A purpose of the test arrangement 300 is to determine whether the DUT telephone 104 is vulnerable to transmitting interference signals to a remote or "far-end" telephone 302 with which the DUT telephone 104 is linked by a voice signal path 304. One or more line simulators and/or a telephone impairment test set may be used to form the voice signal path 304 between the DUT telephone 104 and the far-end telephone 302. The far-end telephone 302 is located outside of the test chamber 102 and is preferably located/shielded so that it is not exposed to the test signal applied to the DUT telephone 104.

The test arrangement 300 further includes a detection path 122' that is coupled to receive and monitor the output of the far-end phone 302 and may be similar to the detection path 122 that is coupled to the DUT telephone 104. The detection path 122' includes an amplifier 124' and a coupler 126' by the which the amplifier 124' is coupled to the far-end telephone 302 to receive a signal or signals output from the far-end telephone 302. The detection path 122' further includes a bandpass filter 128' coupled to the amplifier and a multimeter 130' coupled to the filter 128' to measure the level of the far-end phone output, as amplified by the amplifier 124' and filtered by the filter 128'. The multimeter 130' is coupled to the control device 108 to provide a measurement output to the control device 108. The measurement provided by the multimeter 130' may be indicative of an interference signal, if any, transmitted to the far-end telephone 302 from the DUT telephone 104 in response to the test signal applied to the DUT telephone 104. The components of the detection path 122' may be similar to, or even identical in construction to, the components of the detection path 122.

Figure 4:
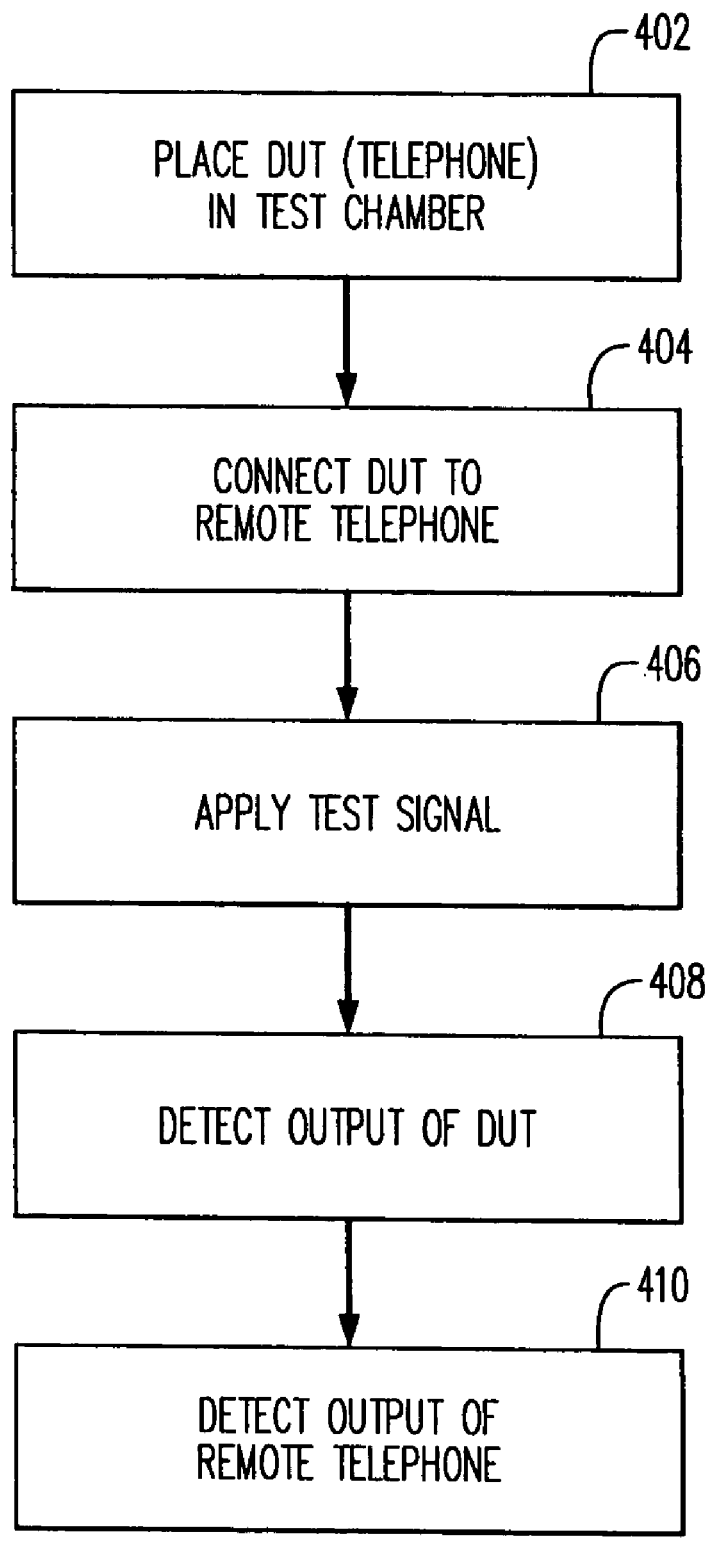
FIG. 4 is a flow diagram that illustrates an exemplary process that may be performed in the test arrangement of FIG. 3.

FIG. 4 is a flow diagram that illustrates an exemplary process that may be performed in the test arrangement 300 of FIG. 3. At 402 in FIG. 4, the DUT telephone 104 is placed in the test chamber 102. Before or after the DUT telephone 104 is placed in the test chamber 102, the DUT telephone 104 is coupled so that its output is provided to the detection path 122. At 404, the voice signal path 304 is established between the DUT telephone 104 and the far-end telephone 302. This is also done either before or after placing the DUT telephone 104 in the test chamber 102. At 406, the test signal is applied to the DUT telephone 104 in the test chamber. This may be done in the same manner described above in connection with the process of FIG. 2.

At 408 in FIG. 4, the detection path 122 of the test arrangement 300 may detect and/or measure the output of the DUT telephone 104 and may provide resulting measurements to the control device 108. Further, the control device 108 may receive, analyze, etc. the measurements from the detection path 122. These activities may be performed in the same manner as in the process of FIG. 2.

Further, at 410, the detection path 122' of the test arrangement 300 may detect and/or measure the output of the far-end telephone 302 (e.g., simultaneously with application of the test signal) to determine whether and/or to what extent interference signals are transmitted from the DUT telephone 104 to the far-end telephone 302 as a result of the application of the test signal to the DUT telephone 104. The measurements output from the detection path 122' may be provided to the control device 108, which may store, tabulate and/or analyze the measurements to provide an indication as to whether or not the DUT telephone 104 is vulnerable to RF interference of a sort which causes the DUT telephone 104 to transmit audible interference to another telephone to which it is linked by a voice communication path. A transmission impairment measurement set (TIMS—not separately shown) may be employed as part of the detection path 122'.

In some embodiments, it may be considered that the results of the test are acceptable if any interference received at the far-end telephone 302 does not exceed 30 dBrnC.

Figure 5:
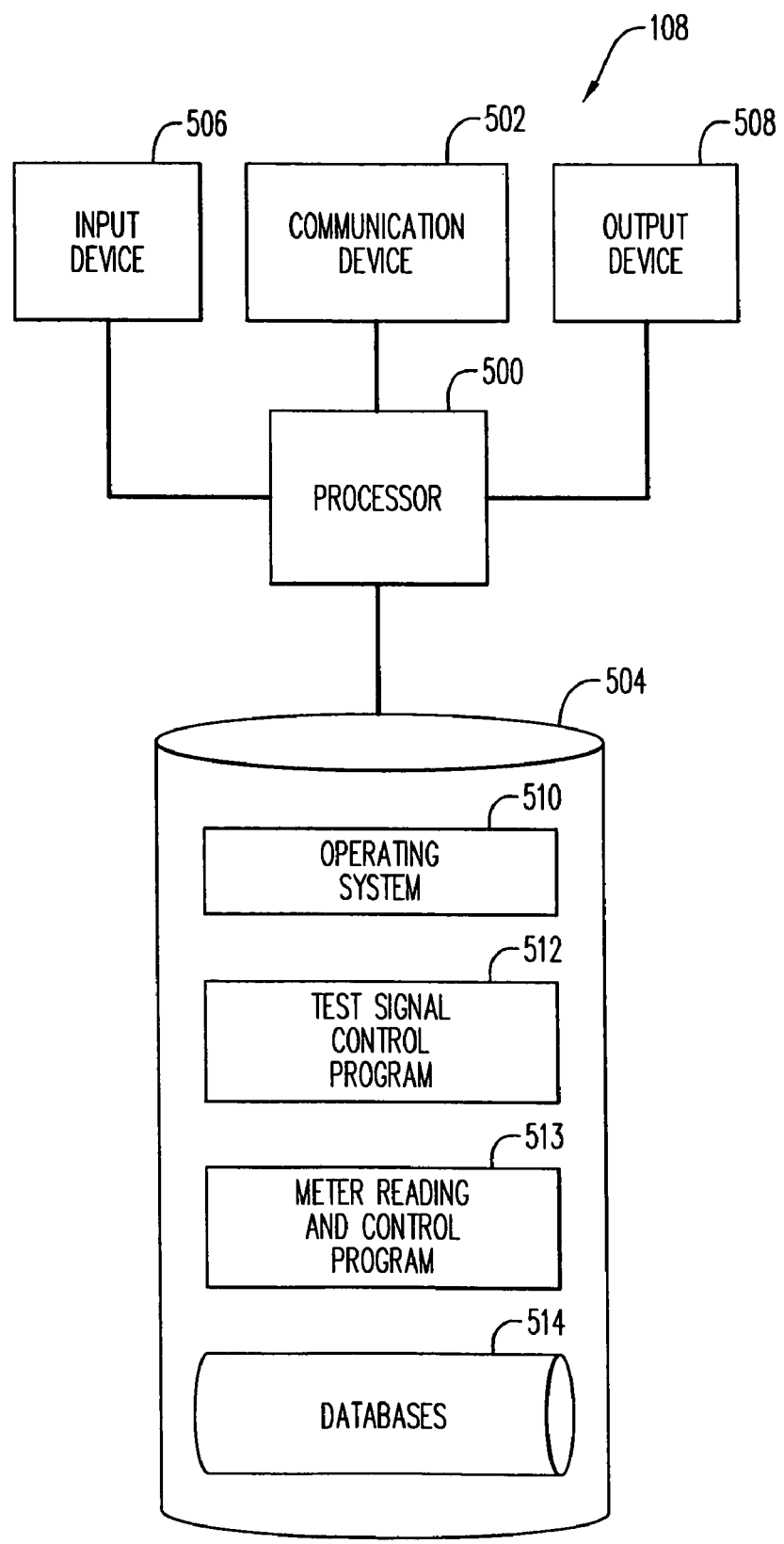
FIG. 5 is a block diagram of one embodiment of a control device that may be part of the test arrangement(s) of FIG. 1 and/or FIG. 3.

Reference is now made to FIG. 5, where an example embodiment of the control device 108 is shown. As depicted, control device 108 includes a processor 500 operatively coupled to a communication device 502, a storage device 504, an output device 508 (e.g., a display and/or a printer), and one or more input devices 506. Some or all of the hardware constituting the control device 108 may be conventional personal computer (PC) hardware. Thus the processor 500 may be a conventional Pentium® processor, for example, and the communication device 502 may be a conventional communication port which enables the control device 108 to exchange data with the test signal generator 110 and/or the multimeter(s) 130 (and/or 130') via, e.g., an Ethernet connection. The storage device 504 may include a conventional hard disk drive or other mass storage device and/or other types of memory such as random access memory (RAM) and/or read only memory (ROM).

The input devices 508 may include a conventional keyboard and/or a conventional pointing device such as a mouse or trackball. The ROM, if present, may store basic input/output instructions and instructions used during boot-up of control device 108. The RAM may provide fast data storage and retrieval and thus may function as working memory for processor 500. In addition, the RAM may temporarily store instructions corresponding to processor-executable process steps being executed by processor 500.

Storage device 504 stores one or more programs for controlling processor 500. The programs include an operating system 510, a program 512 to allow the control device 108 to control generation of the test signal, a program 513 to allow the control device to receive and analyze test measurement information from the detection path(s) 122 (and/or 122'), and possibly other applications as well, which are not separately indicated. The programs comprise processor-executable process steps of control device 108. The programs may also include, for example, device drivers. Storage device 504 may also store one or more databases 514.

Under control of the programs stored in the storage device 504, the control device 108 may control the over-all operation of the test arrangements described above, and may perform the functions described in connection with the processes of FIGS. 2 and 4.

A testing procedure or procedures like those described above may make it possible to identify potential vulnerability of office equipment to interference from wireless devices. The use of pulse-modulated and/or high-powered signals may reflect more accurately than conventional testing procedures sources of potential interference that may be encountered in the real world in view of the proliferation of wireless devices in offices and conference rooms. Application of the procedures of the present invention may allow manufacturers to trouble-shoot equipment designs and to revise designs so that equipment that is actually sold may be substantially immune to types of interference that may be encountered in actual use.

Embodiments described herein call for testing for interference exhibited by the DUT or for testing both for such interference and for interference transmitted to a far-end telephone. Other embodiments, however, may test only for interference transmitted to a far-end telephone, so that the near-end detection path may be omitted.

In embodiments described hereinabove, the test signal applied to the DUT in the test chamber is generated by a test signal generator. However, in other embodiments, the test signal may be generated in an alternative manner. For example, a sample RF transmission may be generated from a cellular telephone or other handheld wireless device. The sample RF transmission may be captured as a sample signal with a vector signal analyzer and stored as an IQ file or in some other manner. (As is known to those who are skilled in the art, an "IQ file" is a data file that is produced by IQ modulation, i.e., by modulation of both in-phase and quadrature components of a waveform.) During test operations, the stored sample signal may be reproduced in the test chamber as a test signal. Reproduction of the stored sample signal may utilize a vector signal generator.

The flow diagrams and other descriptions of processes herein are not meant to imply a fixed order of steps. Rather, the process steps may be performed in any order that is practicable.

The present invention has been described in terms of several embodiments solely for the purpose of illustration. Persons skilled in the art will recognize from this description that the invention is not limited to the embodiments described, but may be practiced with modifications and alterations limited only by the spirit and scope of the appended claims.

What is claimed is:

1. A method comprising:
   placing a device under test (DUT) in a test chamber;
   wirelessly applying a pulse-modulated radio frequency (RF) test signal to the DUT in the test chamber using an antenna; and
   detecting a power level of an acoustic output of the DUT with a receiving device, wherein the acoustic output is in a range of 20 Hz to 20 kHz.

2. The method of claim 1, wherein the DUT is a telephone.

3. The method of claim 2, wherein the telephone is a speakerphone.

4. The method of claim 1, wherein the DUT is a microphone.

5. The method of claim 1, wherein the test signal is a 100 Hz repetition of a 100 microsecond pulse.

6. The method of claim 5, wherein the applying step includes varying an RF carrier frequency in a range of 800 MHz to 6.0 GHz.

7. The method of claim 1, wherein the receiving device is an RF immune microphone in the test chamber.

8. The method of claim 1, wherein a wireless mobile telephone is a source of the pulse-modulated RF test signal.

9. A method comprising:
   placing a device under test (DUT) in a test chamber;
   wirelessly applying a radio frequency (RF) test signal to the DUT in the test chamber using a mobile wireless telephone; and
   detecting a power level of an acoustic output of the DUT in a range of 20 Hz to 20 kHz using a receiving device and a bandpass filter;
   wherein the test signal has a strength of at least 30 V/m in at least a portion of the test chamber.

10. The method of claim 9, wherein the test signal has a strength of at least 90 V/m in at least a portion of the test chamber.

11. The method of claim 9, wherein the DUT is a telephone.

12. The method of claim 11, wherein the telephone is a speakerphone.

13. The method of claim 9, wherein the receiving device is a telephone connected to the DUT.

14. An apparatus comprising:
    a test chamber;
    an antenna in the test chamber;
    test signal means, coupled to the antenna, for applying a wireless pulse-modulated RF test signal to a device under test located in the test chamber using the antenna; and
    means, associated with the test chamber, for detecting and measuring an acoustic output level of the device under test, wherein the acoustic output is in a range of 20 Hz to 20 kHz.

15. The apparatus of claim 14, wherein the wireless RF test signal has a strength of at least 30 V/m in at least a portion of the test chamber.

16. The apparatus of claim 15, wherein the test signal means includes a control device programmed to cause the test signal means and the antenna to generate the wireless RF test signal in the test chamber having the strength of at least 30 V/m in at least the portion of the test chamber.

17. The apparatus of claim 15, wherein the means for detecting and measuring comprises a coupler, an amplifier, and a bandpass filter.

18. The apparatus of claim 15, wherein the test signal means is configured using a wireless telephone and the means for detecting and measuring comprises an RF-immune microphone.

* * * * *